United States Patent [19]
Welch et al.

[11] Patent Number: 4,809,288
[45] Date of Patent: Feb. 28, 1989

[54] HYBRID Y-JUNCTION LASER ARRAY

[75] Inventors: David Welch; Donald R. Scifres, both of San Jose; Peter Cross; William Streifer, both of Palo Alto, all of Calif.

[73] Assignee: Spectra Diode Laboratories, Inc., San Jose, Calif.

[21] Appl. No.: 21,640

[22] Filed: Mar. 4, 1987

[51] Int. Cl.$^4$ ............................................. H01S 3/19
[52] U.S. Cl. ........................................ 372/46; 372/45; 372/50
[58] Field of Search .................. 372/45, 46, 50, 43, 372/44, 48; 357/17

[56] References Cited

U.S. PATENT DOCUMENTS

| | | | |
|---|---|---|---|
| 4,255,717 | 3/1981 | Scifres et al. | 331/94.5 |
| 4,594,718 | 6/1986 | Scifres et al. | 372/45 |
| 4,594,719 | 6/1986 | Ackley | 372/50 |
| 4,692,925 | 9/1987 | Botez | 372/46 |

OTHER PUBLICATIONS

Welch et al.; "In-Phase Emission From Index-Guided Laser Array Up to 400 mW"; Electronics Letters; Mar. 13, 86; vol. 22, No. 6 pp. 293-294.
Yang et al., "Single-Lobed Emission from Phase-Locked Array Lasers", Electronic Letters, vol. 22, No. 1, pp. 2-4, published Jan. 2, 1986.
Wang et al., "In-Phase Locking in Diffraction-Coupled Phased-Array Diode Lasers", Applied Physics Letters, vol. 48, No. 26, pp. 1770-1772, pub. Jun. 30, 1986.

*Primary Examiner*—William L. Sikes
*Assistant Examiner*—B. Randolph
*Attorney, Agent, or Firm*—Thomas Schneck

[57] ABSTRACT

A semiconductor laser array having a plurality of waveguides at least some of which are directly joined at Y-junctions. The region near the Y-junctions provides a phase boundary condition in which lightwaves propagating in adjacent waveguides are in phase. A combination of strong and weak waveguiding is provided, with strong waveguides that eliminate evanescent coupling from occuring at least in the Y-junction regions, and with weak guides near one or both end facets permitting evanescent coupling. The evanescent coupling between adjacent weak waveguides preserves the in phase relationship that was established in the Y-junction regions, resulting in a diffraction limited single lobe far field output. Alternatively, even without evanescent coupling, the modes can adjust their phases in the weak waveguides, where the propagation constant is less tightly specified by the geometry.

23 Claims, 4 Drawing Sheets

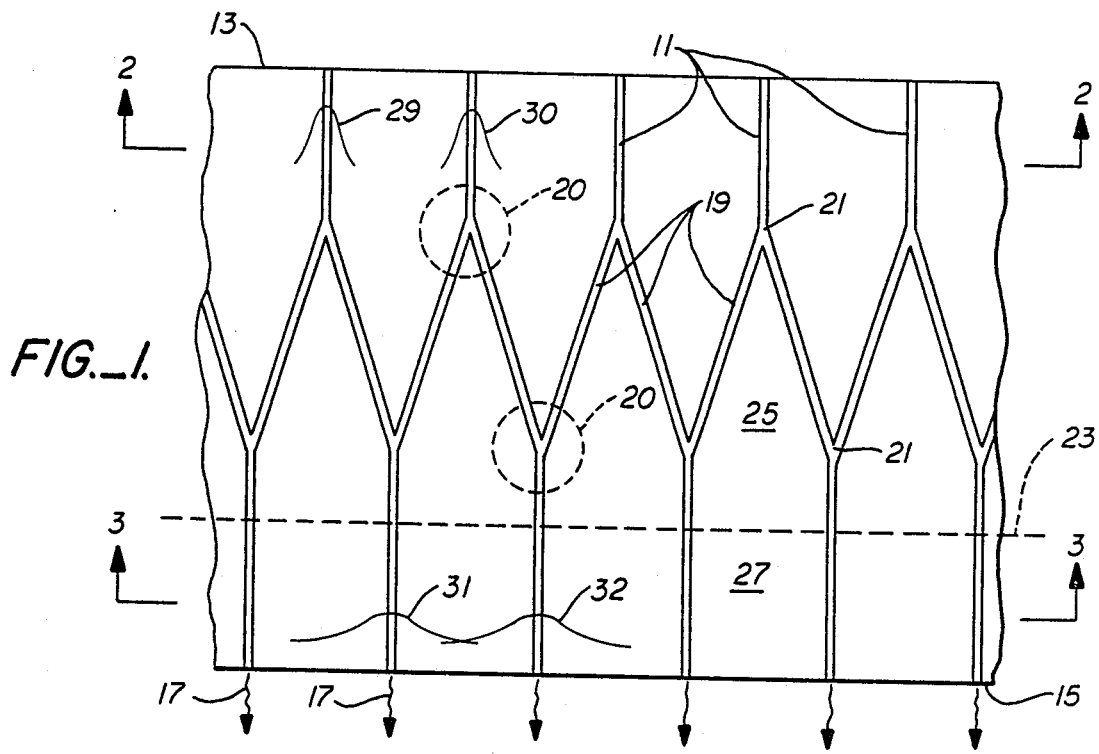
FIG._1.
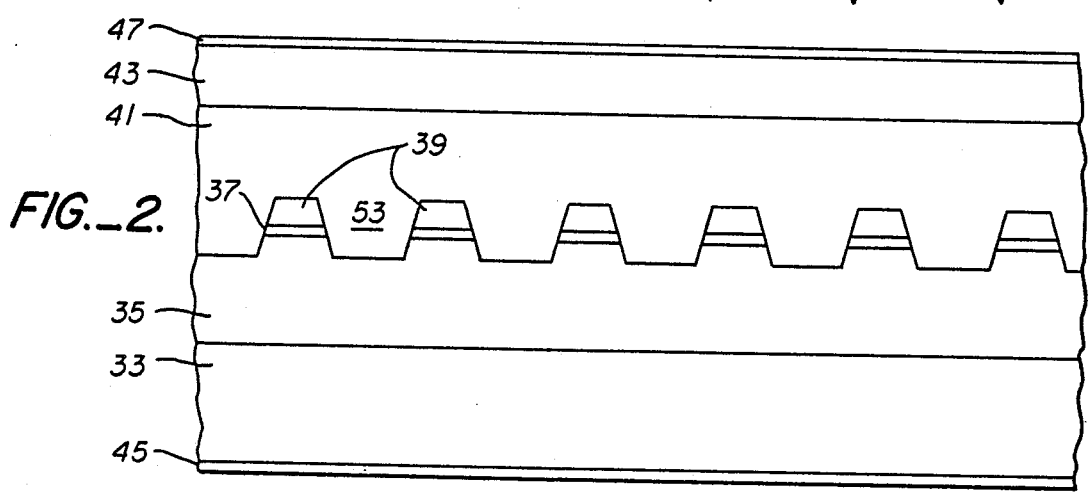
FIG._2.
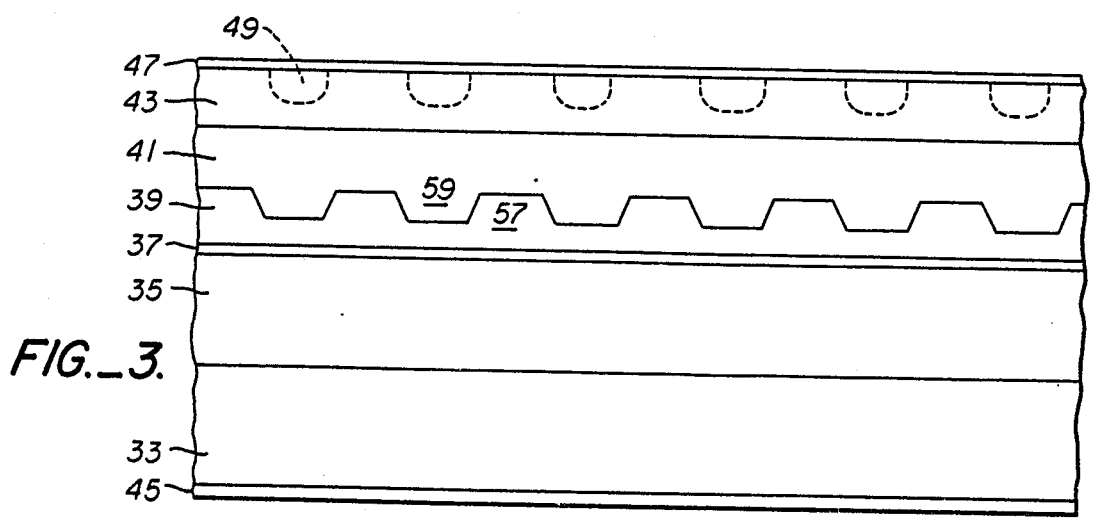
FIG._3.

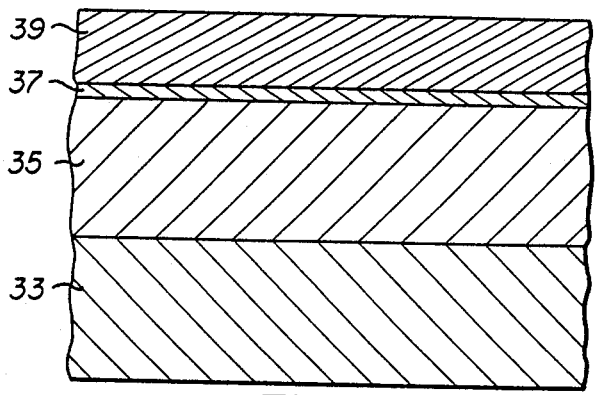
FIG._4A.
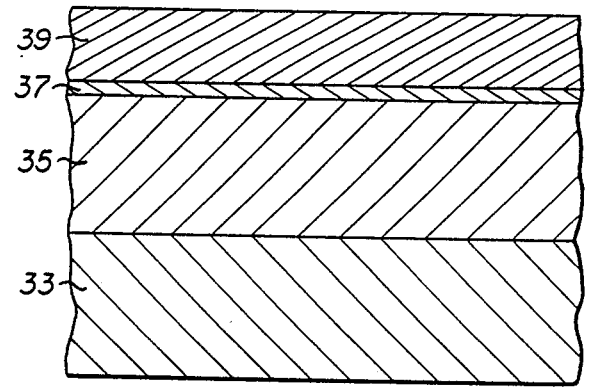
FIG._4B.
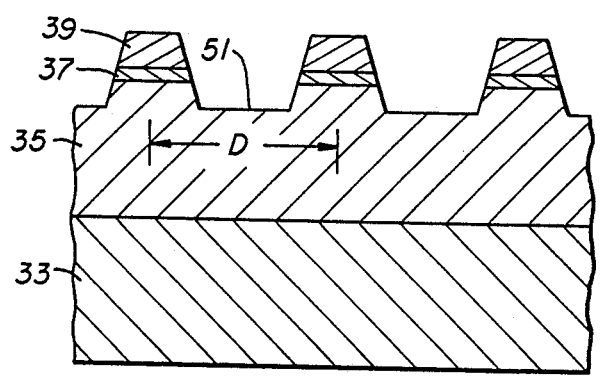
FIG._5A.
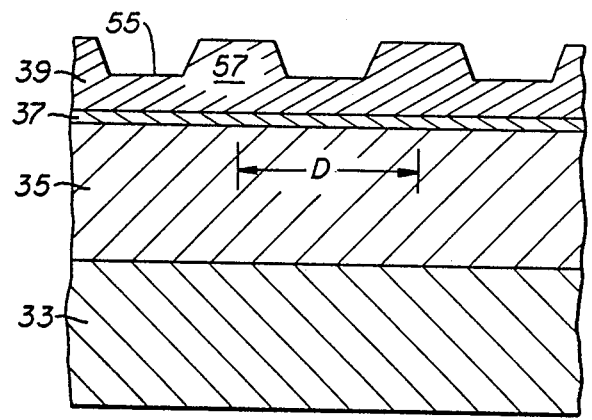
FIG._5B.
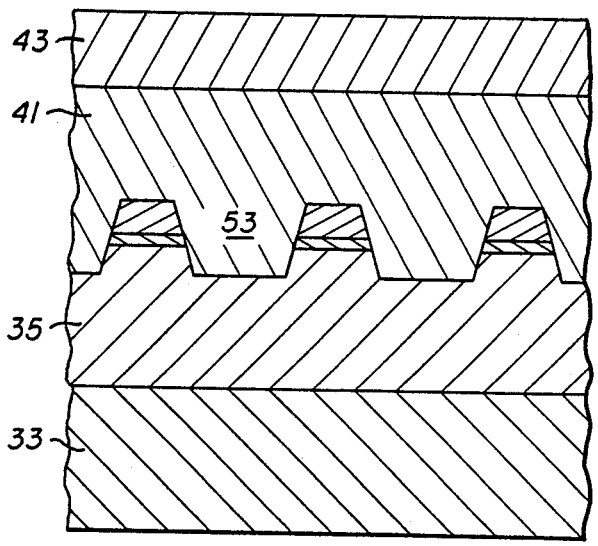
FIG._6A.
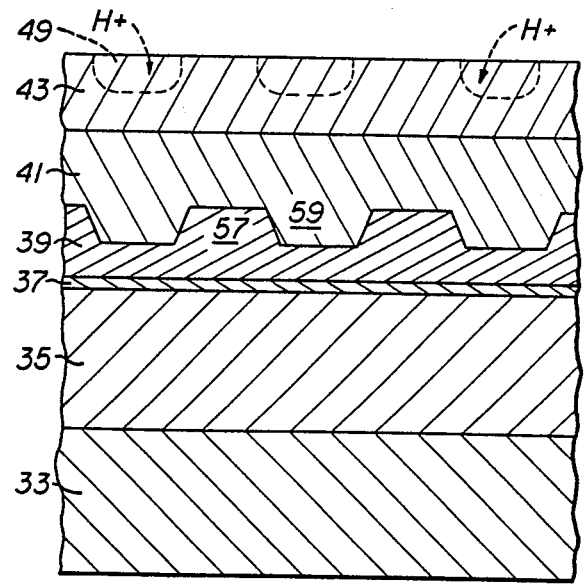
FIG._6B.

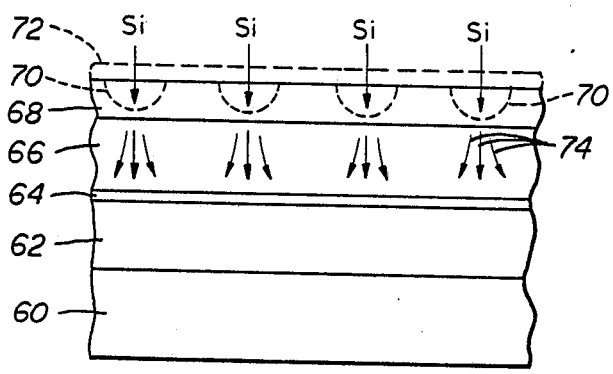
FIG._7.
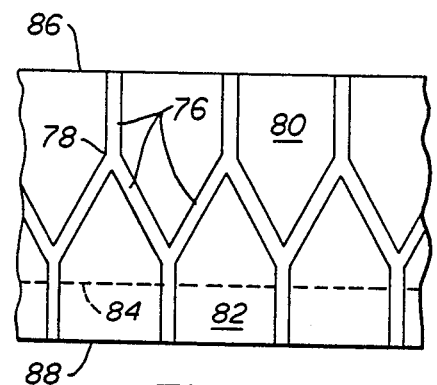
FIG._8.
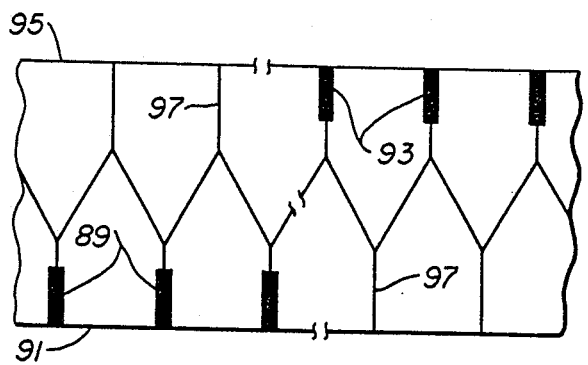
FIG._10.
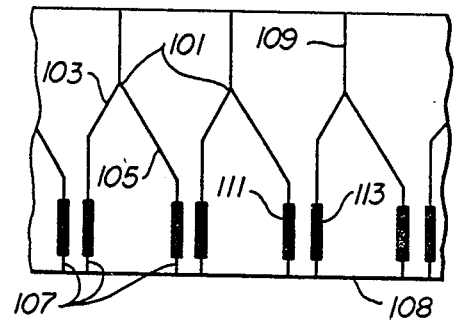
FIG._11.
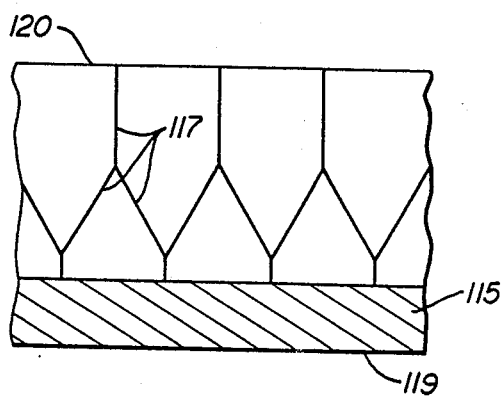
FIG._12.
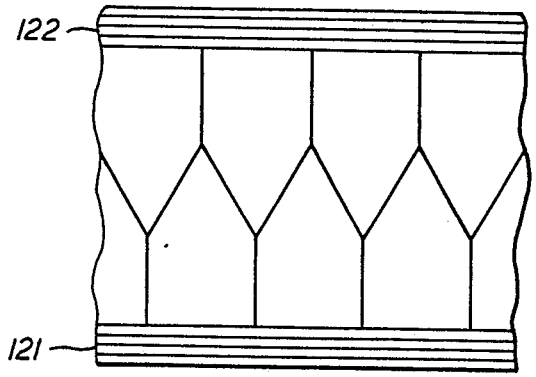
FIG._13.

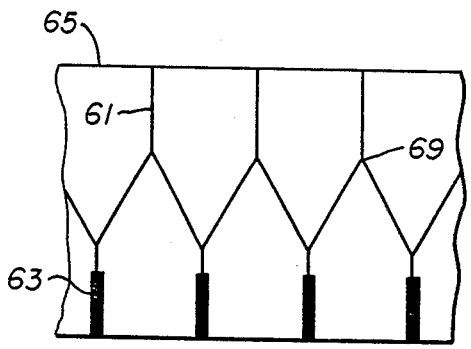
FIG._9A.
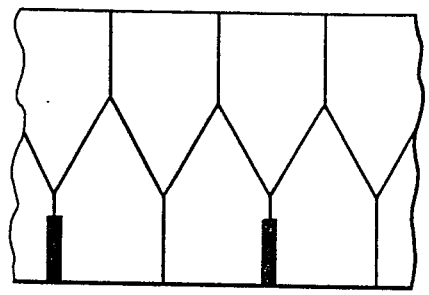
FIG._9B.
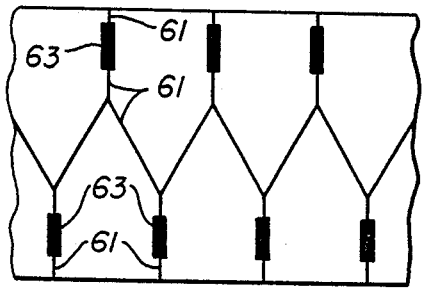
FIG._9C.
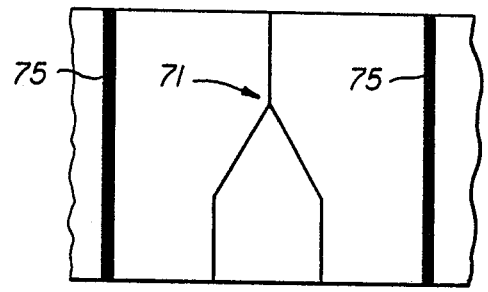
FIG._9D.
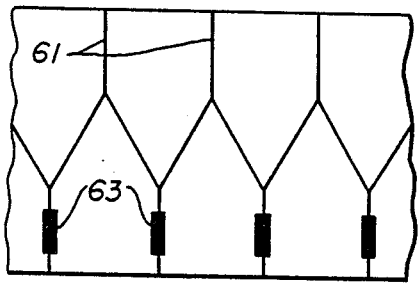
FIG._9E.
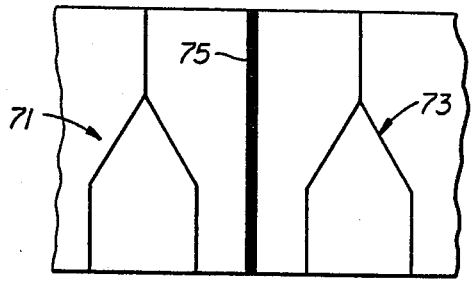
FIG._9F.
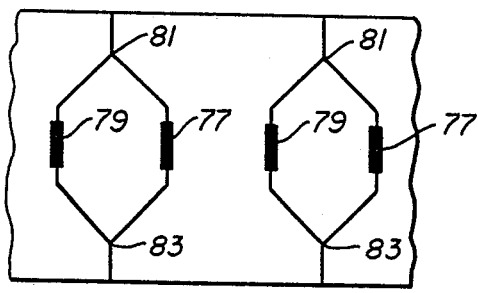
FIG._9G.
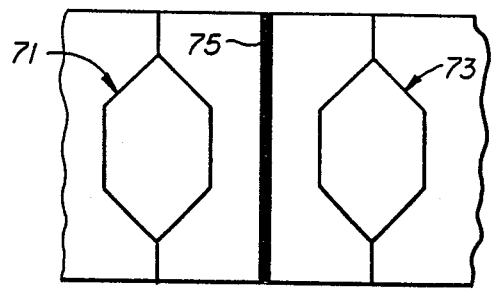
FIG._9H.

HYBRID Y-JUNCTION LASER ARRAY

DESCRIPTION

1. Technical Field

The present invention relates to semiconductor laser arrays and in particular to laser arrays with waveguiding structures for diffraction-limited single-lobed far field output.

2. Background Art

In U.S. Pat. No. 4,594,718, Scifres et al. disclose semiconductor lasers provided with a combination of index and gain guiding regions in the optical cavity established between the laser end facets. In one embodiment, a laser array comprises a substrate with a cross-shaped configuration. Consecutively deposited on the substrate are a cladding layer, an active layer consisting of a single quantum well layer or multiple quantum well layers, a second cladding layer and a contact layer. The configuration is provided with a contiguous central gain guiding region that extends transversely through the laser array with a plurality of narrow index guiding regions extending from the central region to either end facet. This configuration allows coupling of the light in the gain guided sections for phase locked operation.

Yang et al. in "Single-lobed Emission from Phase-locked Array Lasers", Electronics Letters, vol. 22, no. 1, pp. 2-4 (Jan. 2, 1986), disclose diffraction coupled laser arrays with single-lobe far-field operation with a full-width at half-maximum (FWHM) very close to the theoretical diffraction limit. The arrays are ridge waveguide devices which occupy most of the resonator length, except for a diffraction region. Light from the waveguide section propagates in the common unguided section where it diffracts. On reflection from the resonator mirror, some of the light reflects back into the waveguides. Although the majority of the reflected light is coupled back into the same waveguide from which it originated, a portion of it enters adjacent waveguides In-phase operation of the arrays depends critically on the length of the diffraction section. If the phase difference between the reflected light from a waveguide and the reflected light from an adjacent waveguide is an integral multiple of $2\pi$, the reflections reinforce in-phase lasing. In practice, the diffraction region needs to be a certain minimum length to make the arrays operate in phase.

In U.S. Pat. No. 4,255,717, Scifres et al. disclose a monolithic laser device in which interconnecting lateral waveguides are provided to deflect and directly couple light propagating in one or more adjacent spatially displaced emitting segments. Waveguiding may be provided for both the emitting segments and the interconnecting lateral waveguides by a refractive index change due to an injected charge distribution determined by current confining channels or contact stripes or due to material thickness or composition change. The interconnecting branching waveguides, termed the "Y-junction region" because of the Y-shaped junctions connecting the interconnecting waveguides with the parallel emitting segments, are used to attenuate any out-of-phase components from propagating. The Y-junction region results in boundary conditions on the phase component to be in-phase.

It has been discovered that in order for the Y-junction region to eliminate the out-of-phase modes, the waveguide structure must be strong enough to suppress evanescent coupling in the Y-junction region. The evanescent coupling, or optical wave overlap between adjacent cavities, tends to result in the propagation of out-of-phase modes. Once the light propagates away from the Y-junction region there are no restrictions on the relative phase of the adjacent emitters except at the emitting facet. Slight variations in the processing or growth of the wafer can therefore result in phase errors of the light as it propagates along the waveguides. The far field pattern as a result is broadened due to the phase randomization away from the Y-junction region.

It is an object of the present invention to produce laser arrays which eliminate the phase randomization in Y-junction arrays, thereby resulting in a diffraction limited far field pattern.

DISCLOSURE OF THE INVENTION

The above object has been met with a hybrid Y-junction laser array in which phase randomization is eliminated by introducing weaker waveguides along a portion of the optical path away from the Y-junction regions. Either by coupling these weaker waveguides along their length or by allowing the guided waves to adjust their own propagation constants, the phase information, controlled by the Y-junction region, is preserved, so that the laser array radiates in the in-phase far field mode.

The laser array comprises a plurality of semiconductor layers disposed in a heterostructure on a substrate. At least one of the layers forms an active region for lightwave generation and propagation under lasing conditions. Electrode contacts inject current into the active region to produce the light waves which then propagate in a resonant optical cavity defined between reflective end facets. A plurality of waveguides associated with the active region guide the lightwaves between the facets. At least some of the adjacent waveguides are directly coupled together by interconnecting waveguides at Y-shaped junctions. Lightwaves propagating in one waveguide combine with lightwaves propagating in an adjacent waveguide in a Y-junction region defined near the Y-shaped junctions and reinforce one another if they are in phase.

The nature of the laser array is such that portions of the waveguides, including at least the Y-junction region, are strong waveguides characterized by sufficiently strong guiding to fix the modal propagation constants and to eliminate evanescent coupling between adjacent waveguides. Other portions of the waveguides away from the Y-junction region are not strong waveguides and may be characterized by weak lightwave guiding so as to allow the modes to select their own propagation constants and/or to cause evanescent coupling between adjacent waveguides. Strong waveguides can include buried heterostructure waveguides, channeled-substrate-planar waveguides, impurity induced disordering waveguides, and others. Weak waveguides can include ridge waveguides, channeled-substrate-planar waveguides, gain guides, and others. Various embodiments are provided which differ in the locations of the weak guiding portions, strong guiding portions and Y-junction regions.

BRIEF DESCRIPTION OF THE DRAWING

FIG. 1 is a simplified top plan of a laser array of the present invention showing the Y-junction waveguides, and lightwave profiles for weak and strong waveguide portions.

FIG. 2 is a side section of the laser array taken along the line 2—2 in FIG. 1.

FIG. 3 is another side section of the laser array taken along the line 3—3 in FIG. 1.

FIGS. 4A, 5A and 6A are side sections showing the manner of making the laser array taken along line 2—2 in FIG. 1.

FIGS. 4B, 5B and 6B are side sections further showing the manner of making the laser array taken along line 3—3 in FIG. 1.

FIG. 7 is a side section of a laser array of the present invention with impurity induced disordering.

FIG. 8 is a simplified top plan of the laser array of FIG. 7 illustrating Y-junction waveguides and portions with variable dose implants.

FIGS. 9A–9H and FIGS. 10–13 are schematic top plans of the waveguides for various embodiments of the laser array of the present invention.

BEST MODE FOR CARRYING OUT THE INVENTION

With reference to FIG. 1, a laser array has a plurality of generally parallel spatially displaced waveguides 11 for guiding lightwaves propagating in an active region under lasing conditions in a resonant optical cavity defined between an end facet 13 and an end facet 15. Waveguides 11 form laser light emitters at one or both of the facets 13 and 15 from where a plurality of beam elements 17 are radiated. The number of emitters may range from a few to several thousand or more and the beam elements are preferably radiated in phase with one another so as to form a diffraction limited single lobe far field pattern.

Adjacent waveguides are directly connected together by interconnecting waveguides 19 at Y-shaped junctions 21. Lightwaves from adjacent waveguides propagating in interconnecting waveguides 19 interact in Y-junction regions 20 defined near Y-shaped junctions 21. If light from adjacent waveguides are in phase with one another, they reinforce one another in Y-junction region 20, and the resulting superposed lightwave continues to propagate. But if light from adjacent waveguides are out of phase from one another, the resulting superposed lightwave is attenuated. Waveguides 11 preferably support a single mode in order to enhance the attenuation of out of phase modes. The Y-junction regions 20 result in boundary conditions causing the phase component of propagating lightwaves to be in phase.

In the laser array in FIG. 1, a dashed line 23 demarcates regions of the laser array which contain waveguides that are either strongly or weakly guiding. Region 25 from dashed line 23 to rear end facet 13 contains waveguides 11 characterized by strong waveguiding properties, while region 27 between dashed line 23 and front end facet 15 contains waveguides 11 characterized by weak waveguiding properties. A strong index guide is defined as one that eliminates evanescent coupling between waveguides to an extent that the waveguides would remain incoherent in an array unless other types of coupling, such as Y-junctions 21, are introduced. A weak index guide is defined as one in which the waveguides are either normally evanescently coupled to such extent that they would emit coherently if no other coupling mechanism were present or the waveguides are such that the modal propagation constant is not tightly fixed, i.e. the propagation constant varies through evanescently coupled regions more than in strong index guide regions. As a result of strong waveguiding in regions 25, lightwaves 29 and 30 propagating in adjacent waveguides 11 have narrow widths, much smaller than the separation between the adjacent waveguides, so that evanescent coupling, i.e. optical wave overlapping, is eliminated. On the other hand, lightwaves 31 and 32 propagating in adjacent waveguides 11 of weak guiding region 27 have broad widths on the order of the waveguide separation, so that wave overlapping, i.e. evanescent coupling, may occur.

In order for Y-junction regions 20 to eliminate out of phase modes, the waveguiding must be strong enough to eliminate evanescent coupling. Evanescent coupling tends to result in the propagation of out-of-phase modes, because the out-of-phase modes have a zero electric field amplitude between the waveguides which coincides with the zero or low gain regions between adjacent waveguides. Accordingly, strong guiding region 25 includes at the very least Y-junction regions 20 around Y-shaped junctions 21. Regions of the laser array away from Y-junction regions 20 need not eliminate evanescent coupling and may have either strong or weak waveguides 11.

Once lightwaves propagate away from Y-junction regions 20, there are no restrictions on the relative phase of the adjacent emitters except at the facets 13 and 15. Without coupling between the adjacent waveguides 11, or permitting the phase to self-adjust, slight variations in the processing of the laser array can result in phase randomization of the light waves as they propagate along the waveguides. Weakly guided regions 27 are thus provided to preserve the phase information derived from the Y-junction regions by allowing evanescent coupling or phase adjustment of the lightwaves.

A preferred strong waveguiding structure is the buried heterostructure seen in FIG. 2. Other strong waveguides can include channeled-substrate-planar (CSP) waveguides, impurity induced disordering waveguides, mesa substrate index guides, as well as other structures known in the art. A preferred weak waveguiding structure is the ridge waveguide seen in FIG. 3. Other weak waveguides can include ridge waveguides, CSP waveguides, rib waveguides, impurity induced disordering waveguides, gain guides, broad area lasers, and other structures known in the art. CSP waveguides can be made either strongly or weakly waveguiding by varying the width and separation of the channels etched into the substrate and the thickness of the overlying cladding layer. Narrow distantly spaced channels result in little optical wave overlapping or evanescent coupling, while broad closely spaced channels result in considerable evanescent coupling. A CSP waveguide where the high loss substrate material is within 0.2 $\mu$m of the active region also produces a strong wave guide. Impurity induced disordering waveguides can also be made either weakly or strongly guiding by varying the disordering depth as described below with reference to FIGS. 7 and 8.

With reference to FIG. 2, the buried heterostructure comprises a substrate 33 upon which are successively disposed layers 35, 37, 39, 41 and 43 of semiconductor material. Likewise, the ridge waveguide structure in FIG. 3 comprises the same plurality of semiconductor layers 35, 37, 39, 41 and 43 disposed over substrate 33. The laser array in FIG. 1 is a monolithic structure formed over a single substrate 33. The manner of fabrication determines the various thicknesses for various portions of the different layers, which in turn determines whether a particular region of the array is a buried heterostructure with strong waveguiding or a ridge waveguide structure with weak guiding characteristics. Laser arrays are preferably fabricated on a wafer substrate by metal-organic chemical vapor deposition, but may also be fabricated by liquid phase epitaxy, molecular beam epitaxy or other known crystal growth processes.

Substrate 33 is typically composed of n-GaAs. Cladding layer 35 is typically composed of n-$Ga_{1-x}Al_xAs$, where x is usually about 0.4, with a doping level in a range from $10^{17}$ to $10^{18}$ cm$^{-3}$ (Se) and a thickness greater than 1.0 μm. The first upper cladding layer 39 is typically composed of p-$Ga_{1-y}Al_yAs$, where y is about 0.3, and the doping level is in a range from $10^{17}$ to $10^{18}$ cm$^{-3}$ (Mg) In the buried heterostructure of FIG. 2, layer 39 has a thickness in a range from 0.3 to 0.4 μm. In the ridge waveguide structure of FIG. 3, layer 39 has a minimum thickness of from 0.25 to 0.3 μm and a maximum thickness which is approximately 0.5 μm. The second upper cladding layer 41 is typically composed of p-$Ga_{1-z}Al_zAs$, where z is about 0.4, and the doping level is in a range from $10^{17}$ to $10^{18}$ cm$^{-3}$ (Mg) Layer 41 is at least 1.0 μm thick, and typically about 1.5 μm thick. Cap layer 43 is typically composed of p-GaAs with a doping level of about $10^{19}$ cm$^{-3}$ (Zn) and a thickness of about 0.5 μm. Composition variations of up to 5 percent are permissible.

Active region 37 may or may not be intentionally doped and might consist of four 50 to 150 Å thick quantum wells of GaAs alternating with three 30 to 150 Å thick barriers of $Ga_{0.8}Al_{0.2}As$. Such quantum-well structures are known and described in an article by N. Holonyak, Jr. et al. entitled "Quantum-well Heterostructure Lasers" in IEEE Journal of Quantum Electronics, vol. QE-16, no. 2 (February, 1980), pp. 170-186. Alternatively, instead of a plurality of thin layers in a quantum-well or multiple-quantum-well heterostructure, active region 37 may be formed from a single layer of $Ga_{1-w}Al_wAs$, where W is typically less than 0.1. This layer may comprise the active region for a separate confinement heterostructure perhaps with graded index cladding layers. In any case, layer 37, with the highest effective index of refraction and lowest band gap, forms an active region for lightwave generation and propagation under lasing conditions. The index of refraction is greatest for active region 37 typically about 3.55, about 0.005 lower for cladding layer 39, and lowest for cladding layers 35 and 41.

It will, of course, be recognized that the conductivity type of the layers may be reversed from those noted above. Likewise, instead of GaAs and GaAlAs, other light emitting semiconductor materials, such as GaAlSb, InP, InGaAsP, other Group III-V compounds, Group II-VI compounds and Group IV-VI compounds may be used. Moreover, the dimensions, doping levels, compositions and dopants mentioned above are exemplary only.

Conductive contact layers 45 and 47 are deposited on substrate 33 and cap layer 43 respectively and provide a metallization for electrode connection for forward biasing of the laser array and current injection whereby light is generated in active region 37. Contact layer 45 is typically composed of Au/Ge alloy. Contact layer 47 is typically composed of a Ti/Pt/Au alloy.

The laser array of FIG. 1 has strong and weak waveguides 11 in optical proximity to active region 37 which define a plurality of adjacently spaced apart optical cavities. The laser array also has interconnecting waveguides 19 for directly joining waveguides 11 together. In FIG. 2, waveguides are provided by burying pieces of active region 37 in surrounding semiconductor layers 35, 39 and 41 with lower refractive index and higher bandgap. Due to the lateral confinement provided by second upper cladding layer 41 in etched regions 53, this is a strong index guide. In FIG. 3, waveguides are provided by a variation in thickness of first upper cladding layer 39. Lightwaves propagating in active region are weakly confined beneath thick regions 57, and some optical energy leaks into the areas beneath thin regions 59 where overlapping with lightwaves from adjacent waveguides occurs.

Referring to FIGS. 4-6, both the strong and weak waveguides are formed together on a single substrate 33. FIGS. 4A, 5A and 6A show formation of the buried heterostructure in FIG. 2, while FIGS. 4B, 5B and 6B show formation of the ridge waveguide structure in FIG. 3. First, as seen in FIGS. 4A and 4B, the n-type cladding layer 35, active region 37 and the first upper cladding layer 39 are grown on substrate 33 using one of the known crystal growth processes mentioned above. Layer 39 is typically grown to a thickness of about 0.5 μm. A 0.05 μm GaAs layer may be deposited on layer 39 to passivate the surface.

Next the wafer is removed from the growth chamber and a waveguide pattern, such as those seen in FIGS. 9A-H is developed lithographically in a photoresist layer deposited over the passivation layer. After pattern definition, the wafer is etched in a standard etchant solution. The waveguide pattern is etched into the wafer at different depths. The region which is to be a buried heterostructure is etched at least 0.5 μm deep so as to produce channels 51 etched through the active region. The weakly guided region is not etched as deeply to produce channels 55 about 0.25 to 0.3 μm above the active region and ridges 57 about 0.5 μm thick. Typical etch rates for etchant solution used is 0.4 μm/min., resulting in etch times of approximately 75 seconds for strongly guided regions and approximately 30 seconds for weakly guided regions. In practice, etching is a two step process. Initially the strong guided regions are etched uniformly to a depth 0.25 μm above the active layer. The index guide pattern is then etched through the active layer of the strongly guided regions in FIG. 5A and above the active layer in the weak guided regions in FIG. 5B. After etching, the photoresist layer is stripped off with a solvent, such as acetone, and the wafer is etched again in the same etch solution for 10 seconds to remove the GaAs passivation layer and to produce a clean surface for crystal growth. Typically, the remaining portions of active region 37 in FIG. 5A are about 0.5 to 2.0 μm wide, and the ridges are spaced apart, center-to-center, by a distance D of from 4 to 6 μm.

The wafer is reintroduced to the growth chamber where the second upper cladding layer 41 is grown, followed by cap layer 43. The material may be processed further to create electrically confining insulating layers 49 in cap layer 43. Typically, the surface of cap layer 43 is implanted with protons H+ over channel regions 59 of the weakly guided ridge structure. The buried heterostructure does not require an insulating proton implant for electron confinement. The metallizations 45 and 47 seen in FIGS. 2 and 3 are then deposited to create ohmic contacts to the surfaces. The device is then cleaved into individual laser array die with end facets 13 and 15 in FIG. 1 being defined by the cleavages.

With reference to FIGS. 7 and 8, another method of creating both strong and weak index guides in a hybrid laser array is through the diffusion of variable dose implants of a disorder inducing impurity to produce variable depth disordering. A substrate 60 is formed and a plurality of semiconductor layers 62, 64, 66 and 68 are deposited on substrate 60. Typically, the layers form a GaAs/GaAlAs heterostructure. Substrate 60 is typically composed of n-type GaAs. Cladding layer 62 is at least one micron thick and typically composed of n—$Ga_{0.7}Al_{0.3}As$. Cladding layer 62 is similarly at least one micron thick but composed of p-type $Ga_{0.7}Al_{0.3}As$. A cap layer 68 is typically about 0.5 micron thick and composed of p-type GaAs. The compositions and thicknesses may vary by about 5 percent, the conductivity types may be reversed, and other semiconductor materials may be used. The layers include an active region 64 sandwiched between cladding layers 62 and 66 for lightwave generation and propagation under lasing conditions.

A disorder inducing impurity, such as silicon, is implanted into cap layer 68, forming implants 70, shown in phantom. For example, silicon may be implanted at an energy of about 80 kev, and capped with a layer 72, shown in phantom, of $Si_3N_4$. After implantation, the impurity is diffused through the semiconductor layer, as shown by arrows 74. Such diffusion may be produced by annealing the implanted semiconductor wafer at elevated temperatures for a predetermined period of time. Th impurity defines a waveguide pattern, seen in FIG. 8, having a plurality of spaced apart waveguide elements 76, at least some of which are directly connected together at Y-shaped junctions 78.

By varying the implantation dose, the index of refraction of portions of the heterostructure can be varied. For example, in FIG. 8, a first portion 80 of the waveguide pattern on one side of dashed line 84 is characterized by a first implantation dose, while a second portion 82 of the waveguide pattern on the opposite side of dashed line 84 is characterized by a second implantation dose. Typically, the implantation dose in regions 80 is about $1 \times 10^{16}$ silicon atoms per cubic centimeter and the implantation dose in regions 82 is about $1 \times 10^{15}$ silicon atoms per cubic centimeter. A difference in the implantation dose produces a difference in the depth of silicon diffusion, and consequently a difference in the disordering depth, and results in a difference in the index of refraction. Accordingly, the impurity, i.e. silicon, diffuses to a first disordering depth in regions 80, and diffuses to a second disordering depth in regions 82. For example, in one experiment silicon was implanted at an energy of 80 kev and annealed for one hour at 850° C. The disordering depths for implantation doses of $7 \times 10^{14}$ cm$^{-3}$, $3 \times 10^{15}$ cm$^{-3}$ and $1 \times 10^{16}$ cm$^{-3}$ were 0.35 μm, 0.75 μm and 0.9 μm respectively. For an annealing time of two hours, the disordering depths were 0.75 μm, 0.85 μm and 1.2 μm respectively.

The depth of disordering, which is controllable through the implantation dose, is used to create various index changes across the wafer. The laser array structure in FIGS. 7 and 8 have both strong and weak index guiding portions. Portions of waveguides 76 in regions 80 are strongly guided due to the greater disordering depth from the higher implantation dose. Portions of waveguides 76 in regions 82 are weakly guided due to a lesser disordering depth from the lower implantation dose. Thus, a hybrid laser array is created.

With reference to FIGS. 9A-9H, various possible waveguide patterns may be used to produce a single lobed far field output. The pattern in FIG. 9A corresponds to the laser array of FIG. 1. Strong waveguides are represented by thin lines 61, while weak waveguides are represented by thick lines 63. Laser light output may be from either the rear facet represented by top horizontal line 65, the front facet represented by bottom horizontal line 67, or both. In all of the patterns, at least some of the adjacent waveguides are directly coupled together in Y-junction regions defined near Y-shaped junctions 69. In FIGS. 9A, 9B, 9C and 9E, all of the waveguides are directly joined, while in FIGS. 9D, 9F, 9G and 9H, only some of the waveguides are directly joined, the waveguides being organized into groups 71 and 73 of directly coupled waveguides, adjacent groups being evanescently coupled together by weak waveguides 75 therebetween or by weak waveguide portions 77 and 79 in center portions of the waveguides defined between Y-shaped junctions 81 and 83. Weak waveguide portions 63 may be located near both end facets, as in FIG. 9C, or near one end facet, as in FIGS. 9A, 9B and 9E. The waveguides in an array may also alternate between strong and weak guiding, as shown in FIG. 9B. The weak waveguide portions may extend to the end facets, as in FIG. 9A, or may stop short of the end facets, as in FIGS. 9C and 9E. If the waveguides at the emitting facet 65 or 67 are strong waveguides, the guides may be flared, i.e. the width may increase toward the emitting facet, to produce a greater laser beam spot size and thereby reduce the beam divergence of the emitters, as well as reduce the potential for facet damage for high energy laser output.

With reference to FIG. 10, weakly guided laser arrays of the prior art tend to undergo lateral super-radiance when the number of waveguides, array width or waveguide packing density exceeds a certain limit. Lateral superradiance is a condition in which stimulated emission and light amplification occurs for lightwaves propagating in the lateral direction. Lateral super-radiance consumes power that could be used for producing light emission in the longitudinal direction and also produces additional waste heat. To overcome this, the waveguide pattern in FIG. 10 has weak guides 89 near a front facet 91 for a portion of the laser array width, then switches to have weak guides 93 near a rear facet 95. Lateral superradiance is prevented because any laterally propagating light across weak guides 89 or 93 encounters strong guides 97 that attenuate the laterally propagating lightwaves before a lasing threshold is reached or too many injected charges are lost to superradiance. Typically, the switch of weak waveguides from front to rear facet, and vice versa, occurs every few hundred micrometers.

In FIG. 11, a waveguide pattern has asymmetric Y-junctions 101. By "asymmetric" we mean that the waveguide branches 103 and 105 from a Y-junction 101 have different lengths. This produces waveguides 107 with non-uniform spacing at a light emitting facet 108. Portions 109 of the waveguides, including Y-junctions 101, are characterized by strong waveguiding, while other portions 111 and 113 are characterized by weak waveguiding. The non-uniform waveguide spacing tends to produce a diffraction-limited single lobed far field profile when each of waveguide elements emits light in phase.

In FIG. 12 a gain guided broad area section 115 with no lateral waveguide is coupled to the end of the Y-junction array 117. This section allows either evanescent coupling of filaments which form or adjustment of propagation constant between the mirror 119 and the strong waveguides 117.

In FIG. 13, the mirrors 119 and 120 of FIG. 10 have been replaced with distributed feedback (DFB) gratings 121 and 122. Such gratings provide optical feedback and can also diffract light out of the surface of the laser if the grating period is second order or greater. The grating areas 121 and 122 are weakly guided broad area gain guided sections.

Referring again to FIG. 1, the interface at dashed line 23 between strong and weak waveguiding regions 25 and 27, respectively, produces some loss which causes a slight increase in the lasing threshold. The loss is determined by the mode mismatch of the lightwave profiles 29 and 31, and is more severe for abrupt transitions than for more gradual transitions. The transition may be made more gradual by producing a third region between the strong and weak guiding regions 25 and 27, respectively, of intermediate waveguiding character. This third region may be a ridge waveguide structure in which the cladding layer 39 is etched deeper than the ridge waveguides in FIG. 3, but not through the active region 37. In any case, the etching of deep channels in the buried heterostructure of FIG. 2 normally produces a slope between the weak and strong waveguide regions that results in a somewhat gradual transition.

The laser arrays of the present invention provides a combination of weak and strong waveguides that eliminates or reduces phase randomization away from the Y-junction regions. The resulting arrays emit light characterized by a diffraction limited single lobe far field profile.

We claim:

1. A semiconductor laser array comprising,
a plurality of contiguous semiconductor layers, at least one of said layers forming an angle region for lightwave generation,
means for injecting current into said active region to produce said lightwaves,
means for establishing optical feedback within sad laser for said lightwaves sufficient to provide lasing,
a plurality of spaced apparatus waveguides transmitting light generated from said active region, lightwaves propagating in at least some waveguides being directly phase coupled together in a branching coupling region, said waveguides having strong waveguide portions and weak waveguide portions, said strong waveguide portions including said branching coupling region.

2. The semiconductor laser array of claim 1 wherein said strong waveguide portions are formed by a lateral change in material composition.

3. The laser of claim 1 wherein said strong waveguide portions are single transverse mode waveguides.

4. The laser of claim 1 wherein said weak waveguide portions are evanescently coupled to an adjacent waveguide.

5. The laser of claim 1 wherein said weak waveguide portions are a broad area gain section.

6. The laser of claim 1 wherein said branching region allows low loss propagation of the lowest order array mode relative to the higher order array modes.

7. The semiconductor laser array of claim 1 wherein said weak waveguide portions are located near one end of said waveguides.

8. The semiconductor laser array of claim 1 wherein said weak waveguide portions are located near both ends of said waveguides.

9. The semiconductor laser array of claim 1 wherein said weak waveguide portions extend to the ends of said waveguides.

10. The semiconductor laser array of claim 1 wherein said strong waveguide portions are located near both ends of said waveguides and at some Y-junctions, and said weak waveguide portions are located in center portions of said waveguides between said Y-junctions.

11. The semiconductor laser array of claim 1 wherein groups of directly coupled waveguides are evanescently coupled to adjacent groups of directly coupled waveguides by weak waveguides therebetween.

12. The semiconductor laser array of claim 1 wherein weak waveguide portions are located near one end of the waveguides for a first set of waveguides and near the other end of the waveguides for a second set of waveguides.

13. The laser of claim 1 wherein optical feedback is provided by a distributed feedback grating in said laser.

14. A semiconductor laser array comprising,
a plurality of contiguous semiconductor layers, at least one of said layers forming an active region for lightwave generation,
means for injecting current into said active region to produce said lightwaves,
means for establishing optical feedback within said laser for said lightwaves sufficient to provide lasing, and
a plurality of spaced apart waveguides for guiding lightwaves generated in said active region, at least some of said waveguides being directly connected at branching waveguide junctions, said lightwaves propagating in said directly connected waveguides capable of interacting in branching junction regions defined near said branching waveguide junctions in a compatable phase relationship, said waveguides having strong waveguide portions and weak waveguide portions, said portions of said waveguides near said branching junction regions being strong waveguide portions.

15. The laser array of claim 14 wherein said strong waveguide portions are provided by portions of one of said semiconductor layers laterally surrounding segments of said active region.

16. The laser array of claim 14 wherein said weak waveguide portions are provided by changes in thickness of one of said semiconductor layers.

17. The laser array of claim 14 wherein said weak waveguide portions are located near one end one the waveguides.

18. The laser array of claim 14 wherein said weak waveguide portions are located near both ends of the waveguides.

19. The laser array of claim 14, wherein said compatible phase relationship is an in-phase relationship between lightwaves propagating in different waveguides.

20. A semiconductor laser array comprising,
a plurality of semiconductor layers disposed on a substrate, at least one of said layers forming an active lasing region, said plurality of layers further including cladding layers sandwiching said active lasing region and having a lower index of refraction and higher bandgap than said active region, means for injecting current into said active region to produce said lightwaves, means for providing optical feedback of said lightwaves in said laser, and a plurality of laterally spaced apart waveguides for guiding light generated in said active region, at least some of said waveguides being directly connected at branching waveguide junctions, said lightwaves propagating in said directly connected waveguides into branching junction regions defined near said branching waveguide junctions to establish a compatible phase relationship, said waveguides having strong waveguide portions and weak waveguide portions, said strong waveguide portions including said branching junction regions.

21. The semiconductor laser of claim 20 wherein said feedback means comprise reflective end facets bounding said active region.

22. The semiconductor laser array of claim 1 wherein said strong waveguide portions are formed by a lateral change in material thickness.

23. The semiconductor laser array of claim 1 wherein said plurality of spaced apart waveguides are nonuniformly spaced said branching coupling region being asymmetric.

* * * * *

UNITED STATES PATENT AND TRADEMARK OFFICE
CERTIFICATE OF CORRECTION

PATENT NO. : 4,809,288

DATED : February 28, 1989

INVENTOR(S) : David Welch et al.

It is certified that error appears in the above-identified patent and that said Letters Patent is hereby corrected as shown below:

Column 7, line 32, "Th impurity" should read - - The impurity - -.

Claim 1, column 9, line 40, "forming an angle region" should read
- - forming an active region - -.

Claim 1, column 9, line 44, "within sad" should read
- - within said - -.

Claim 1, column 9, line 47, "spaced apparatus waveguides" should
read - - spaced apart waveguides - -.

Claim 23, column 12, line 12, "spaced said" should read
- - spaced, said - -.

Signed and Sealed this

Seventeenth Day of April, 1990

Attest:

HARRY F. MANBECK, JR.

*Attesting Officer*       *Commissioner of Patents and Trademarks*